(12) United States Patent
Choi

(10) Patent No.: US 9,496,166 B2
(45) Date of Patent: Nov. 15, 2016

(54) SUBSTRATE TRANSFERRING ARM AND SUBSTRATE TRANSFERRING APPARATUS INCLUDING THE SAME

(71) Applicant: ASM IP Holding B.V., Almere (NL)

(72) Inventor: Young Seok Choi, Daejeon (KR)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/735,253

(22) Filed: Jun. 10, 2015

(65) Prior Publication Data
US 2015/0380286 A1 Dec. 31, 2015

(30) Foreign Application Priority Data
Jun. 30, 2014 (KR) ........................ 10-2014-0081197

(51) Int. Cl.
*B66F 19/00* (2006.01)
*H01L 21/687* (2006.01)
*B25J 11/00* (2006.01)

(52) U.S. Cl.
CPC ...... *H01L 21/68707* (2013.01); *B25J 11/0095* (2013.01)

(58) Field of Classification Search
CPC .......... H01L 21/68707; H01L 21/67742; H01L 21/67778; H01L 21/67766; H01L 21/67748; B25J 15/0475; B25J 11/0095; B25J 9/044; Y10S 901/17

USPC ........................................... 294/213
See application file for complete search history.

(56) References Cited

U.S. PATENT DOCUMENTS

| | | | | |
|---|---|---|---|---|
| 7,717,481 B2 * | 5/2010 | Ng | ...... | H01L 21/67742 294/213 |
| 8,375,884 B2 * | 2/2013 | Mizunaga | ...... | H01L 21/67109 118/319 |
| 2005/0006916 A1 * | 1/2005 | Mantz | ...... | H01L 21/68707 294/103.1 |
| 2006/0113806 A1 * | 6/2006 | Tsuji | ...... | H01L 21/68707 294/213 |
| 2006/0182530 A1 * | 8/2006 | Wang | ...... | H01L 21/67739 414/217 |
| 2010/0061828 A1 * | 3/2010 | Asari | ...... | H01L 21/68707 414/160 |
| 2010/0290886 A1 * | 11/2010 | Hashimoto | ...... | B25J 9/042 414/800 |
| 2012/0126555 A1 * | 5/2012 | Mantz | ...... | H01L 21/68707 294/81.5 |

* cited by examiner

*Primary Examiner* — Stephen Vu
(74) *Attorney, Agent, or Firm* — Lex IP Meister, PLLC

(57) ABSTRACT

A substrate transporting arm and a substrate transporting apparatus to prevent a substrate from sliding and increase a process speed of the substrate, thereby improving productivity. The substrate transporting arm includes a body and a plurality of substrate supporters coupled to the body. Each of the plurality of substrate supporters includes a substrate holder and a substrate supporter pin, and an inner side of the substrate holder includes an inclined portion.

16 Claims, 4 Drawing Sheets

SUBSTRATE TRANSFERRING ARM AND SUBSTRATE TRANSFERRING APPARATUS INCLUDING THE SAME

CROSS-REFERENCE TO RELATED APPLICATION

This application claims priority to Korean Patent Application No. 10-2014-0081197 filed on Jun. 30, 2014, and all the benefits accruing therefrom under 35 U.S.C. §119, the content of which in its entirety is herein incorporated by reference.

BACKGROUND (a) Field

The present disclosure relates to a substrate transporting arm and a substrate transporting apparatus including the same.

(b) Description of the Related Art

Recently, various methods have been suggested to increase throughput in operating a semiconductor manufacturing apparatus. One of the methods is to reduce transporting time of a substrate. For instance, when a method in which an unprocessed substrate loaded on a transporting arm is stood by in front of a reaction chamber and promptly interchanged with a processed substrate when a scheduled process for the substrate in the reaction chamber is completed is used, a waiting time of the reaction chamber is reduced, and thereby overall process time for a plurality of substrates being reduced. In addition, it is significant to promptly process a plurality of substrates because there may be a plurality of substrates such as a substrate undergone the process, a substrate scheduled to be moved to a cooler as well as a substrate waiting the process, etc.

In general, a moving speed of the substrate transporting arm is increased in order to expedite transporting of the substrate. However, it may cause movement or sliding of the substrate on the transporting arm during the transporting process, thereby decreasing productivity.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention provides a substrate transporting arm which prevents a substrate from sliding and a substrate transporting apparatus including the same.

An exemplary embodiment of the present invention provides a substrate transporting arm including a body and a plurality of substrate supporters which are coupled to the body. Each of the plurality of substrate supporters includes a substrate holder and a substrate supporter pin, and an inner side of the substrate holder includes an inclined portion.

An exemplary embodiment of the present invention provides a substrate transporting apparatus including a substrate transporting arm, and a substrate transporting portion to which the substrate transporting arm is attached. Each substrate transporting arm includes a body and a plurality of substrate supporters which are coupled to the body, and the plurality of substrate supporters include a substrate holder and a substrate supporter pin, and an inner side of the substrate holder includes an inclined portion. An upper surface of the substrate holder may be higher than an upper surface of a substrate loaded on the substrate transporting arm.

The substrate holder, at the inclined portion, may have a shape in which a horizontal cross-sectional area of the substrate holder is wide at a lower portion and becomes narrower towards an upper portion of the substrate holder.

The inclined portion of the substrate holder may be a curved surface.

The curvature of the curved surface may be from about 1 mm to about 10 mm.

A horizontal cross-sectional area of the substrate supporter pin may become narrower towards the upper portion.

The upper surface of the substrate holder may be higher than the summit of the substrate supporter pin.

The substrate supporter pin may include at least one of cerazol, FFPM (Perfluorinated Elastomer), ceramic, aluminum, glass carbon, or the like.

A surface roughness of the substrate supporter pin may be from about 0.1 to 3.2.

The substrate transporting arm and the substrate transporting apparatus including the same according to an exemplary embodiment of the present invention may prevent the substrate from sliding and increase a substrate process speed, thereby improving productivity.

DETAILED DESCRIPTION OF THE EMBODIMENTS

Figure 1:
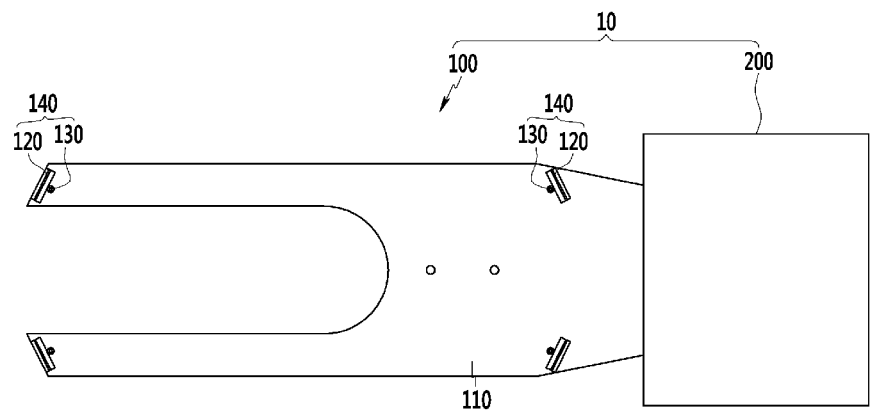
FIG. 1 is a schematic view of a substrate transporting apparatus according to an exemplary embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly. The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, referring to FIG. 1, a substrate transporting apparatus according to an exemplary embodiment of the present invention will be described. FIG. 1 is a schematic view of a substrate transporting apparatus according to an exemplary embodiment of the present invention.

Referring to FIG. 1, the substrate transporting apparatus 10 according to an exemplary embodiment of the present invention includes a substrate transporting arm 100, and a substrate transporting portion 200 controlling the substrate transporting arm 100.

The substrate transporting arm 100 includes a body 110, a substrate holder 120, and a substrate supporter pin 130.

The substrate holder 120 and the substrate supporter pin 130 are combined with the body 110 so as to constitute a substrate supporter 140. The substrate holder 120 and the substrate supporter pin 130 of the substrate supporter 140 may be assembled after they are formed separately, or may be formed integrally.

An inner side of the substrate holder 120 has an inclined portion. The inclined portion of the inner side of the substrate holder 120 may be in a curved surface shape which has a certain curvature.

An upper surface of the substrate holder 120 is disposed at a position higher than the summit of the substrate supporter pin 130. The upper surface of the substrate holder 120 is disposed at a position higher than the upper surface of the substrate loaded on the substrate transporting arm 100.

The substrate supporter pin 130 includes a material which may prevent the substrate from sliding. For example, it may include at least one of cerazol, FFPM (Perfluorinated Elastomer), ceramic, aluminum, glass carbon, or the like.

The substrate supporter pin 130 may have a surface roughness (Ra) from about 0.1 to about 3.2. When the surface roughness (Ra) of the substrate supporter pin 130 is from about 0.1 to about 3.2, the substrate may be effectively prevented from sliding.

The substrate transporting arm 100 includes a plurality of substrate supporters 140. In an exemplary embodiment illustrated, the substrate transporting arm 100 includes four substrate supporters 140. However, the present invention is not limited hereto, and the substrate transporting arm 100 may include three or less substrate supporters 140 or five or more substrate supporters 140.

Figure 2:
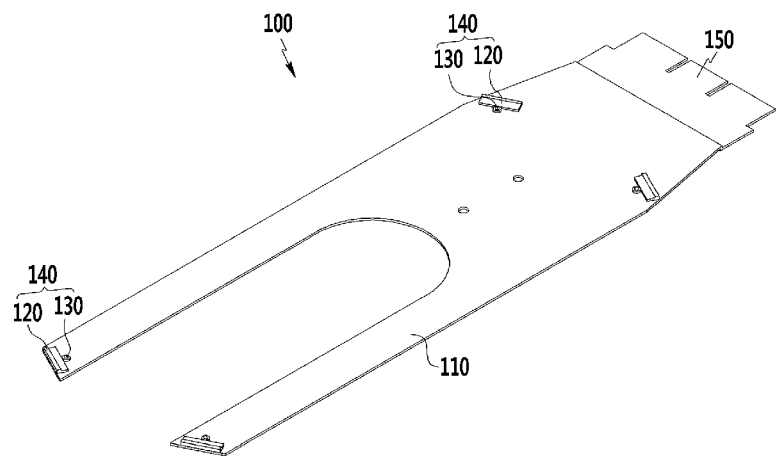
FIG. 2 is a perspective view of a substrate transporting arm of the substrate transporting apparatus according to an exemplary embodiment of the present invention.
Figure 3:
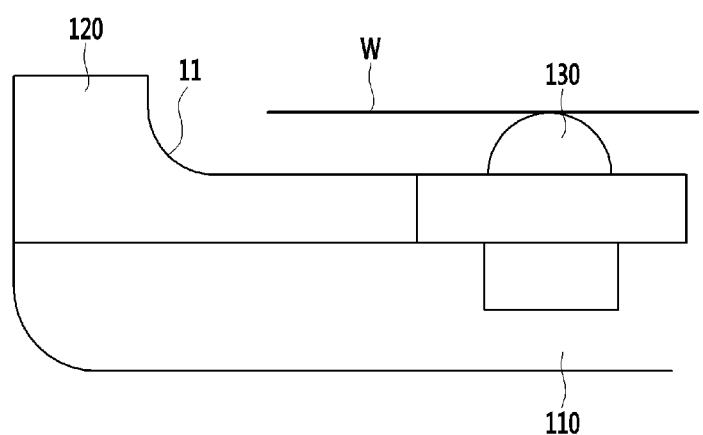
FIG. 3 is a cross-sectional view illustrating a portion of the substrate transporting arm of FIG. 2.
Figure 4:
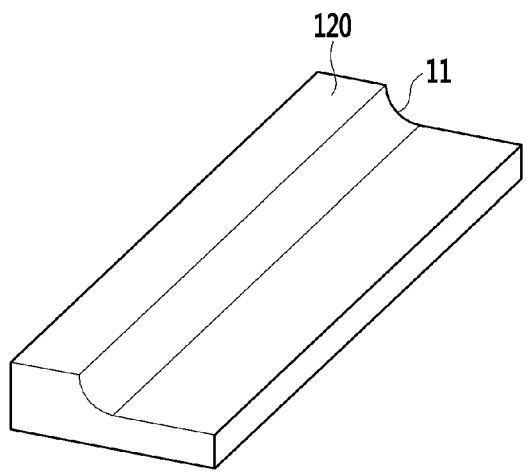
FIG. 4 is a perspective view illustrating a portion of the substrate transporting arm of FIG. 2.
Figure 5:
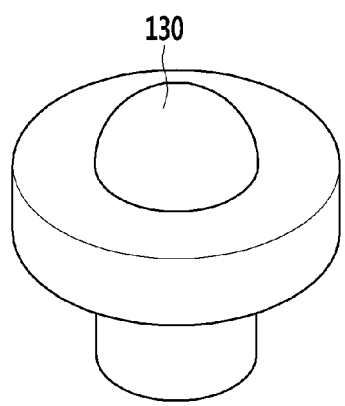
FIG. 5 is a perspective view illustrating a portion of the substrate transporting arm of FIG. 2.

And, referring to FIG. 2, FIG. 3, FIG. 4 and FIG. 5, the substrate transporting arm of the substrate transporting apparatus according to an exemplary embodiment of the present invention will be described in detail. FIG. 2 is a perspective view of a substrate transporting arm of the substrate transporting apparatus according to an exemplary embodiment of the present invention, FIG. 3 is a cross-sectional view illustrating a portion of the substrate transporting arm of FIG. 2, FIG. 4 is a perspective view illustrating a portion of the substrate transporting arm of FIG. 2, and FIG. 5 is a perspective view illustrating a portion of the substrate transporting arm of FIG. 2.

Referring to FIG. 2, the substrate transporting arm 100 according to an exemplary embodiment of the present invention includes the body 110, the substrate holder 120, the substrate supporter pin 130 and a connection portion 150 mounted on the substrate transporting portion 200.

The substrate holder 120 and the substrate supporter pin 130 are combined with the body 110 so as to constitute the substrate supporter 140. The substrate holder 120 and the substrate supporter pin 130 of the substrate supporter 140 may be assembled after they are formed separately, or may be formed integrally.

The substrate transporting arm 100 includes a plurality of substrate supporters 140. In an exemplary embodiment illustrated, the substrate transporting arm 100 includes four substrate supporters 140. However, the present invention is not limited hereto, and the substrate transporting arm 100 may include three or less substrate supporters 140 or five or more substrate supporters 140. In an exemplary embodiment illustrated, the connection portion 150 has a shape of a thin and flat panel with recessed cutouts. The connection portion 150 is inserted into a slot provided in the substrate transporting portion 200 to be fixed to the substrate transporting portion 200. However, the present invention is not limited hereto and the connection portion 150 may have various different shapes and be mounted on the substrate transporting portion 200 in various different ways.

Referring to FIG. 3 and FIG. 4, the upper surface of the substrate holder 120 is disposed at a position higher than the summit of the substrate supporter pin 130. Also, the upper surface of the substrate holder 120 is disposed at a position higher than the upper surface of the substrate W loaded on the substrate transporting arm 100.

An inner side 11 of the substrate holder 120 has an inclined portion. The inclined portion of the inner side 11 is a curved surface with a certain curvature. However, the curvature of the inclined portion may be varied depending on the position. Further, the inclined portion of the inner side 11 may be a flat surface. The inclined portion of the inner side 11 has a curvature from about 1 mm to about 10 mm.

A distance between two substrate holders 120 which face each other across a center of the four substrate holders 120 may be wider than a diameter of the substrate W. Thus, when the substrate W is loaded, the substrate W may be spaced apart from the substrate holder 120. Accordingly, the substrate W may be prevented from unnecessarily colliding with the substrate holder 120 during loading of the substrate W on the substrate holder 120. Therefore, the substrate W is free from impact on its edge by the substrate holder 120.

In case in which the substrate W is moved by sliding, the edge of the substrate W contacts the inclined portion of the inner side 11 of the substrate holder 120 and climbs up the inclined portion of the inner side 11. Therefore, the substrate W is lifted to be inclined, and therefore the lower surface of the substrate W being separated from some of the substrate supporter pins 130. In this case, the lifted substrate W returns to its initial position due to its own weight.

The upper surface of the substrate holder 120 is higher than the upper surface of the substrate W loaded on the substrate transporting arm 100. Thus, even if the substrate W is moved by sliding, the substrate W does not fall outside of the substrate transporting arm 100 because the substrate holder 120 blocks the substrate W. Therefore, the substrate W is prevented from deviating from the substrate transporting arm 100 and returns to its initial position by its own weight. For assuring the prevention of deviation, the substrate holder 120 may have an upper surface that is high enough.

According to the present exemplary embodiment, the inner side 11 of the substrate transporting arm 100 is configured such that a distance between the substrate holder 120 and the substrate W is narrow at a lower portion and becomes wider towards an upper portion of the substrate holder 120.

Since the inner side 11 of the substrate holder 120 has the inclined portion having a certain curvature, even if the substrate W slides and collides with the substrate holder 120, the substrate W returns to its initial position without being damaged on its surface. In the present exemplary embodiment, the overall shape of the substrate holder 120 is a straight lined block. However, the substrate holder 120 may have a curved overall shape.

A distance between two substrate supporter pins 130, which face each other across the center of the four substrate holders 120, may be shorter than the diameter of the substrate W loaded. Thus, even if the substrate W is moved, it may be supported by the substrate supporter pins 130.

Referring to FIG. 3 and FIG. 5, the substrate supporter pin 130 has a contact portion of which horizontal cross section becomes narrower toward the summit. The substrate supporter pin 130 is mounted on the body 110 along with the substrate holder 120.

As shown in FIG. 3 and FIG. 5, the substrate supporter pin 130 has the contact portion which provides a point contact with the substrate to minimize a contact area. In this exemplary embodiment, the contact portion has a shape of half sphere. However, the contact portion may have various structures which may provide a minimized contact area with the substrate. By narrowing the contact area between the substrate and the substrate supporter pin 130, an amount of contamination particles which are generated and diffused by the contact between the substrate and the substrate transporting arm may be reduced.

The substrate supporter pin 130 includes a material which may prevent the substrate from sliding. For instance, the substrate supporter pin 130 may include at least one of cerazol, FFPM (Perfluorinated Elastomer), ceramic, aluminum, glass carbon, or the like.

The substrate supporter pin 130 may have a surface roughness (Ra) from about 0.1 µm to about 3.2 µm. When the surface roughness (Ra) of the substrate supporter pin 130 is from about 0.1 µm to about 3.2 µm, the substrate may be effectively prevented from sliding.

The substrate transporting arm 100 according to an exemplary embodiment of the present invention may prevent the substrate from sliding and provide a self-aligning function which makes the substrate return to its initial position without deviating from the substrate transporting arm 100 even if the substrate slides.

Also, diffusion of the contamination particle is reduced by reducing the contact area between the substrate and the substrate transporting arm.

Figure 6:
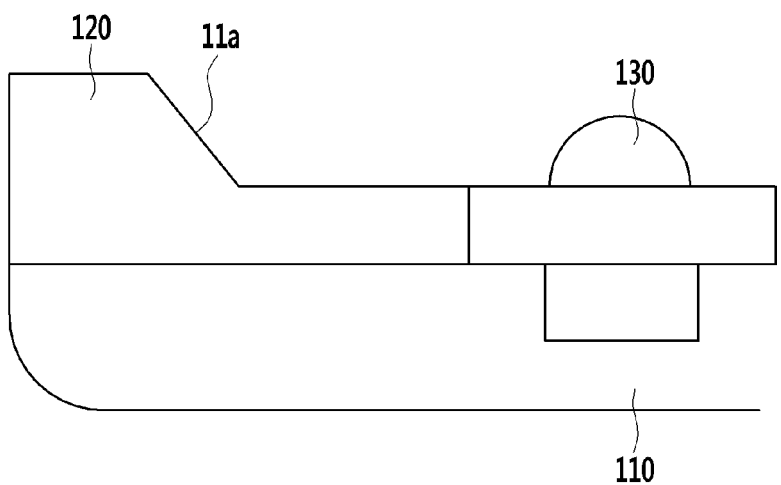
FIG. 6 is a cross-sectional view illustrating a portion of the substrate transporting arm of the substrate transporting apparatus according to another exemplary embodiment of the present invention.

Referring to FIG. 6, the substrate transporting arm 100 according to another exemplary embodiment of the present invention will be described. FIG. 6 is a cross-sectional view illustrating a portion of the substrate transporting arm of the substrate transporting apparatus according to another exemplary embodiment of the present invention.

Referring to FIG. 6, the substrate transporting arm 100 according to the present exemplary embodiment is almost same as the substrate transporting arm illustrated in FIG. 2, FIG. 3, FIG. 4 and FIG. 5. Therefore, detailed description of the same constituent elements will be omitted.

The inner side of the substrate transporting arm 100 according to the present exemplary embodiment does not have the inclined portion with a curvature, but has an inclined portion 11a which is a flat slope. The inclined portion 11a is configured such that the distance between the substrate holder 120 and the substrate W is narrow at the lower portion and becomes wider toward the upper portion of the substrate holder 120. The inclined portion 11a may not be a flat slope if the substrate holder 120 has a curved overall shape. In this case, the inclined portion 11a is also curved but a vertical cross-section of the inclined portion 11a is a straight line as shown in FIG. 6.

The inclined portion 11a of the substrate holder 120 provides a self-aligning function which makes the substrate W return to its initial position without damaging the surface of the substrate W even if the substrate W slides and collides with the substrate holder 120.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A substrate transporting arm comprising:
a body having a top surface; and
a plurality of substrate supporters disposed on the top surface of the body,
wherein:
each of the plurality of substrate supporters includes a substrate holder and a substrate supporter pin to support a substrate,
the substrate holder includes an upper top surface disposed at a position higher than a summit of the substrate supporter pin, a lower top surface disposed at a position lower than the summit of the substrate supporter pin, and an inclined surface connecting the upper top surface to the lower top surface and facing toward the substrate supporter pin,
wherein a height of the inclined surface becomes lower toward the substrate supporter pin, thereby, in a case that an edge of the substrate contacts the inclined surface, the substrate sliding down the inclined surface.

2. The substrate transporting arm of claim 1, wherein:
the upper surface of the substrate holder is higher than an upper surface of a substrate loaded on the substrate transporting arm.

3. The substrate transporting arm of claim 1, wherein:
the substrate holder, at the inclined surface, has a shape in which a horizontal cross-sectional area of the substrate holder is wide at a lower portion and becomes narrower towards the upper top surface.

4. The substrate transporting arm of claim 1, wherein:
the inclined surface of the substrate holder is a curved surface.

5. The substrate transporting arm of claim 4, wherein:
a curvature of the inclined surface is from about 1 mm to about 10 mm.

6. The substrate transporting arm of claim 1, wherein:
a horizontal cross-sectional area of the substrate supporter pin becomes narrower towards the summit.

7. The substrate transporting arm of claim 1, wherein:
the substrate supporter pin includes at least one of cerazol, FFPM (Perfluorinated Elastomer), ceramic, aluminum, and glass carbon.

8. The substrate transporting arm of claim 1, wherein:
a surface roughness of the substrate supporter pin is from about 0.1 µm to about 3.2 µm.

9. A substrate transporting apparatus comprising:
a substrate transporting arm; and
a substrate transporting portion on which the substrate transporting arm is mounted,
wherein:
the substrate transporting arm includes a body and a plurality of substrate supporters coupled to the body,
each of the plurality of substrate supporters includes a substrate holder and a substrate supporter pin to support a substrate,
the substrate holder includes an upper top surface disposed at a position higher than a summit of the substrate supporter pin, a lower top surface disposed at a position lower than the summit of the substrate supporter pin, and an inclined surface connecting the upper top surface to the lower top surface and facing toward the substrate supporter pin,
wherein a height of the inclined surface becomes lower toward the substrate supporter pin, thereby, in a case that an edge of the substrate contacts the inclined surface, the substrate sliding down the inclined surface.

10. The substrate transporting apparatus of claim 9, wherein:
the upper surface of the substrate holder is higher than an upper surface of a substrate loaded on the substrate transporting arm.

11. The substrate transporting apparatus of claim 9, wherein:
the substrate holder, at the inclined surface, has a shape in which a horizontal cross-sectional area of the substrate holder is wide at a lower portion and becomes narrower towards the upper top surface.

12. The substrate transporting apparatus of claim 9, wherein:
the inclined surface of the substrate holder is a curved surface.

13. The substrate transporting apparatus of claim 12, wherein:
a curvature of the inclined surface is from about 1 mm to about 10 mm.

14. The substrate transporting apparatus of claim 9, wherein:
a horizontal cross-sectional area of the substrate supporter pin becomes narrower toward the summit.

15. The substrate transporting apparatus of claim 9, wherein:
the substrate supporter pin includes at least one of cerazol, FFPM (Perfluorinated Elastomer), ceramic, aluminum, and glass carbon.

16. The substrate transporting apparatus of claim 9, wherein:
a surface roughness of the substrate supporter pin is from about 0.1 µm to about 3.2 µm.

* * * * *